(12) United States Patent
Spokoiny et al.

(10) Patent No.: US 7,578,337 B2
(45) Date of Patent: Aug. 25, 2009

(54) HEAT DISSIPATING DEVICE

(75) Inventors: Michael Spokoiny, Chico, CA (US); James M. Kerner, Chico, CA (US); Craig J. Lux, Chico, CA (US); James M. Maurus, Chico, CA (US)

(73) Assignee: United States Thermoelectric Consortium, Chico, CA (US)

( * ) Notice: Subject to any disclaimer, the term of this patent is extended or adjusted under 35 U.S.C. 154(b) by 197 days.

(21) Appl. No.: 11/262,301

(22) Filed: Oct. 27, 2005

(65) Prior Publication Data

US 2006/0231236 A1   Oct. 19, 2006

Related U.S. Application Data

(60) Provisional application No. 60/671,778, filed on Apr. 14, 2005.

(51) Int. Cl.
*F28F 7/00* (2006.01)
*F28F 13/12* (2006.01)
*H05K 7/20* (2006.01)

(52) U.S. Cl. .................................. 165/80.4; 165/109.1

(58) Field of Classification Search ................ 165/80.4, 165/104.33, 109.1, 80.3, 185; 361/699, 702, 361/703; 257/714
See application file for complete search history.

(56) References Cited

U.S. PATENT DOCUMENTS

| | | | | |
|---|---|---|---|---|
| 3,524,497 A | * | 8/1970 | Chu et al. ................... | 165/80.4 |
| 4,188,996 A | * | 2/1980 | Pellant et al. ............... | 165/80.4 |
| 5,021,924 A | | 6/1991 | Kieda | |
| 5,170,319 A | | 12/1992 | Chu | |
| 5,183,104 A | | 2/1993 | Novotny | |
| 5,213,153 A | * | 5/1993 | Itoh ....................... | 165/104.33 |
| 5,220,804 A | | 6/1993 | Tilton | |
| 5,239,443 A | * | 8/1993 | Fahey et al. ................. | 361/689 |
| 5,269,146 A | | 12/1993 | Kerner | |
| 5,412,536 A | | 5/1995 | Anderson | |
| 5,781,411 A | | 7/1998 | Feenstra | |
| 5,831,824 A | | 11/1998 | McDunn | |
| 5,988,266 A | * | 11/1999 | Smith et al. .................... | 165/78 |
| 6,039,114 A | * | 3/2000 | Becker et al. ................ | 165/170 |

(Continued)

OTHER PUBLICATIONS

Ekkad et al., Dimple Enhanced Heat Transfer in High Aspect Ratio Channels, J. Enhanced Heat Trans., 2003, pp. 395-405, vol. 10(4).

(Continued)

*Primary Examiner*—Tho v Duong
(74) *Attorney, Agent, or Firm*—The Webostad Firm

(57) ABSTRACT

A heat dissipation device with a fluid cavity that utilizes a hybrid of star pins with concave surfaces and sharp edges, and truncated dimples, which creates turbulence and a vortex phenomenon perpendicular to fluid flow transmission, and increases the heat transfer coefficient without increasing restriction of fluid flow through the device. This process increases the heat transfer along local pins which are located around each truncated dimple. This effect allows the use of taller pins than previous devices thus increasing the surface of heat transfer and thus these pins have a more efficient heat transfer coefficient along the total length of the pin, not possible previously. Star pins with sharp edges prevent the distortion of the highly efficient vortex flow which increases fluid flow and simultaneously intensifies the desired phenomena of extraordinary turbulence.

16 Claims, 14 Drawing Sheets

U.S. PATENT DOCUMENTS

| | | | |
|---|---|---|---|
| 6,141,214 | A | 10/2000 | Ahn |
| 6,173,758 | B1 | 1/2001 | Ward et al. |
| 6,343,012 | B1 | 1/2002 | Rife |
| 6,366,462 | B1 | 4/2002 | Chu |
| 6,401,807 | B1 | 6/2002 | Wyler |
| 6,469,898 | B1 | 10/2002 | Rouchon |
| 6,650,538 | B1 | 11/2003 | Chu |
| 6,666,260 | B2 | 12/2003 | Tantoush |
| 6,671,172 | B2 | 12/2003 | Carter |
| 6,729,383 | B1 * | 5/2004 | Cannell et al. ............. 165/80.3 |
| 6,807,059 | B1 * | 10/2004 | Dale ........................... 361/703 |
| 6,817,405 | B2 | 11/2004 | Kamath |
| 6,820,684 | B1 | 11/2004 | Chu |
| 6,914,782 | B2 | 7/2005 | Ku |
| 6,940,718 | B2 | 9/2005 | Gedamu |
| 6,973,801 | B1 | 12/2005 | Campbell |
| 6,988,534 | B2 | 1/2006 | Kenny |
| 7,000,684 | B2 | 2/2006 | Kenny |
| 7,035,104 | B2 * | 4/2006 | Meyer ........................ 361/700 |
| 7,174,738 | B2 * | 2/2007 | Scott .......................... 62/259.2 |
| 2003/0011987 | A1 | 1/2003 | Chu |
| 2003/0183368 | A1 | 10/2003 | Paradis et al. |
| 2003/0226371 | A1 | 12/2003 | Rini |
| 2004/0108101 | A1 | 6/2004 | Dugas |
| 2004/0150956 | A1 | 8/2004 | Conte |
| 2005/0047105 | A1 | 3/2005 | Gedamu |
| 2006/0042825 | A1 | 3/2006 | Lu |
| 2006/0126296 | A1 | 6/2006 | Campbell |

OTHER PUBLICATIONS

Isaev et al., Numerical Analysis of the Jet-Vortex Pattern of Flow in a Rectangular Trench, J. Eng. Phys. & Thermophys., 2003, pp. 61-69, vol. 76(1).

Patrick, W.V., Computations of Flow Structures and Heat Transfer in a Dimpled Channel at Low to Moderate Reynolds Number, Apr. 25, 2005, Master's Thesis, Virginia Polytechnic Institute and State University.

Syred et al., Effect of Surface Curvature on Heat Transfer and Hydrodynamics Within a Single Hemispherical Dimple, J. Turbomachinery, Jul. 2001, pp. 609-613, vol. 123.

* cited by examiner

HEAT DISSIPATING DEVICE

CROSS-REFERENCE TO RELATED APPLICATIONS

This application claims priority from U.S. provisional application Ser. No. 60/671,778, filed on Apr. 14, 2005, which is incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention relates to an apparatus for dissipating heat from a surface and, more specifically, to hybrid pin fin and dimpled heat exchanger device and configurations of designs for this hybrid assembly.

2. Description of Related Art

Heat dissipating devices are used to remove heat and reduce the operating temperature of heat generating components such as a microprocessor or other heat generating systems. The heat dissipating device is typically coupled to the component to transfer heat away by conduction. Heat is then dissipated in the heat dissipating device to a moving fluid such as air, or a liquid such as water or oil. Increasing the overall heat transfer coefficient of the heat dissipating device increases the efficiency of heat removal.

Past innovations to increase the heat transfer coefficient and simultaneously enhancing cooling by extending heat exchanger surfaces in a manner that substantially improves heat dissipation have experienced average to poor results. Increasing the heat transfer means increasing heat transfer surface area and means that either laminar or turbulent fluid flow is utilized. Increasing surface area and turbulent flow by positioning pins perpendicular to the direction of flow is typically used.

Previous art has attempted to increased turbulent flow by creating texture, or by threading circular surfaces of pins. These surface textures have been an attempt to enhance heat exchanging capabilities; however, they have, in fact, actually decreased turbulence near the surfaces as turbulent flow has been converted to less efficient laminar fluid flow.

The same results have occurred when pin heights have been increased, as the effective surfaces of the pin heat exchangers actually decreases exponentially as the length of the pins are extended beyond optimal lengths.

Another compounding efficiency limitation in previous art has been when solutions are attempted with a focus on turbulent flow. Previous art has implemented the use of turbulence, but with a negative result because the resultant turbulence has actually restricted fluid flow through the exchanger, therefore reducing efficiencies.

Recently, there have been attempts at improving the art by using either round or oval pins. All pins were tightly formatted in arrays with textured surfaces, attempting to get greater turbulent exchange. However, the high pin density with sharp edges in close proximity actually substantially reduced fluid flow more dramatically thus not significantly improving heat transfer efficiencies. Similarly, when the spacing of the pins was increased, the turbulence would reduce dramatically and heat exchanger efficiencies would sharply fall off.

Other attempts at improving the art have utilized circular or oval dimples on a flat surface, attempting to strongly increase the heat transfer coefficient. However, the vortex of fluid flow is relatively inefficient and not adequate to provide a viable mechanism for heat transfer in heat dissipation devices.

Furthermore, deeper dimples further retard the desired vortex effect as the increased depth decreases turbulence creating stagnant fluid which ultimately decreases heat transfer. Deep dimples do increase the surface area of exposure to fluid, however, the geometry actually reduces turbulence so that there is actually substantially less efficiency compared to shallow dimples; and thus, this attempt at significant improvement of the heat exchanging art has not been successful.

Applying dimple patterns on flat heat transfer surfaces has not significantly improved heat exchanging efficiency.

All such attempts looking to improve the art of turbulization of fluid flow have been attempted based on a single directional, laminar fluid transmission, which have not resulted in significant improvements in heat transfer efficiency.

BRIEF SUMMARY OF THE INVENTION

The invention utilizes a hybrid of star pins with concave surfaces and sharp edges, and truncated dimples, which create an extraordinary turbulence phenomenon in fluid in perpendicular direction of fluid flow transmission, and increasing the heat transfer coefficient without increasing restriction of fluid flow through the heat exchanger.

Applying truncated dimples create a vortex phenomenon in fluid in perpendicular direction of fluid flow transmission. This process increases the heat transfer along local pins which are located around each truncated dimple. This effect allows the use of taller pins than prior art thus increasing the surface of heat transfer and thus these pins have a more efficient heat transfer along the total length of the pin, not possible with prior art.

Star pins with sharp edges prevent the distortion of the highly efficient vortex flow which increases fluid flow and simultaneously intensifies the desired phenomena of extraordinary turbulence. Concave smooth surfaces on each star pin create conditions for increasing of the spiraling vortex over dimples, which in turn also improves heat dissipation characteristics of the heat exchanger.

The hybrid star pin fin exchanger device, with concave surfaces, sharp edges and adjacent truncated dimples increases the heat transfer by concurrently increasing the surface of efficient heat transfer and reducing the pressure drop observed in the fluid flow rate of the system.

An embodiment of the invention is a heat dissipation device that comprises a housing adapted to conduct heat from a heat source, where the housing comprises a first component and a second component, where a first fluid cavity is formed by coupling the first component and the second component, an inlet port fluidly coupled to the first fluid cavity, an outlet port fluidly coupled to the first fluid cavity, where the first fluid cavity is adapted to flow cooling fluid from the inlet port to the outlet port, an array of first star pins positioned in the first fluid cavity and coupled to the housing, where the cross section of the first star pins has at least three concave faces, where the intersection of the concave faces on the first star pins form sharp edges, and an array of first truncated dimples formed in the first fluid cavity.

An aspect of the invention is where the array of first star pins are coupled to the first component, where the array of first truncated dimples are formed on the first component, and where the first truncated dimples are positioned between the first star pins.

Another aspect of the invention is where the first star pins are oriented perpendicular to the flow of cooling fluid in the first fluid cavity.

A further aspect of the invention is where the first star pins have a cross section comprising four concave faces.

A still further aspect of the invention is an array of second truncated dimples formed in the second component, where the second truncated dimples are positioned to align with the first star pins on the first component, and where the first star pins do not touch the second component.

Another aspect of the invention is an array of second star pins coupled to the second component, where the second star pins are positioned in the first fluid cavity, where the second star pins are further positioned to align with the first truncated dimples in the first component, and where the second star pins do not touch the first component.

A further aspect of the invention is where the cross section of the second star pins has at least three concave faces, and where the intersection of the concave faces on the second star pins form sharp edges.

A still further aspect of the invention is where the cross section of the first star pins is the same geometry as the cross section of the second star pins.

Another aspect of the invention is a plurality of chambers formed in the first fluid cavity, where the plurality of chambers is fluidly coupled between the inlet port and the outlet port.

A further aspect of the invention is where the perimeter of the first component is rectangular.

A still further aspect of the invention is a third component coupled to the first component where a second fluid cavity is formed, an array of third star pins coupled to the third component and positioned in the second fluid cavity, an array of third truncated dimples placed in the third component and positioned between the third star pins, and where the second fluid cavity is adapted to flow cooling fluid.

Another aspect of the invention is an array of fourth star pins coupled to the first component and positioned in the second fluid cavity, an array of fourth truncated dimples placed in the second component and positioned between the fourth star pins.

A further aspect of the invention is where the second fluid cavity is fluidly coupled to the first fluid cavity.

Another embodiment of the invention is a heat dissipating device that comprises a first component having a first fluid interface and a first heat conducting surface, where the first heat conducting surface is adapted to conduct heat from a heat source, a second component having a second fluid interface, where a first fluid cavity is formed by coupling the first fluid interface of the first component with the second fluid interface of the second component, an inlet port fluidly coupled to the first fluid cavity, an outlet port fluidly coupled to the first fluid cavity, where the first fluid cavity is adapted to flow cooling fluid from the inlet port to the outlet port, an array of first star pins coupled to the first fluid interface and positioned in the first fluid cavity, where the cross section of the first star pins has at least three concave faces, where the intersection of the concave faces on the first star pins form sharp edges, and an array of first truncated dimples placed in the first fluid interface, where the first truncated dimples are positioned between the first star pins.

Another aspect of the invention is an array of second truncated dimples placed in the second fluid interface, where the second truncated dimples are positioned to align with the first star pins on the first fluid interface, and where the first star pins do not touch the second fluid interface.

A further aspect of the invention is an array of second star pins coupled to the second fluid interface, where the second star pins are positioned to align with the first truncated dimples in the first fluid interface, and where the second star pins do not touch the first fluid interface.

A still further aspect of the invention is where the cross section of the second star pins has at least three concave faces, and where the intersection of the convex faces on the second star pins form sharp edges.

A further embodiment of the invention is a method of dissipating heat from a heat source that comprises providing a heat dissipating device having a first and second component that couple to form a fluid cavity, providing an inlet and outlet port fluidly coupled to the fluid cavity, providing an array of first star pins positioned in the fluid cavity, where the cross section of the first star pins has at least three concave faces, where the intersection of the concave faces form sharp edges, providing an array of first truncated dimples in the first fluid cavity positioned between the first star pins, and transferring heat from the first component to a cooling fluid in the fluid cavity flowing between the inlet port and the outlet port.

Another aspect of the invention is providing an array of second truncated dimples in the fluid cavity, where the second dimples are positioned to align with the first star pins.

A further aspect of the invention is providing an array of second star pins in the fluid cavity, where the second star pins are positioned to align with the first dimples in the fluid cavity.

A still further aspect of the invention is providing a third component that couples to the second component to form a second fluid cavity, providing an array of second star pins positioned in the second fluid cavity, where the cross section of the second star pins has at least three concave faces, where the intersection of the concave faces form sharp edges, providing an array of second truncated dimples in the second fluid cavity positioned between the second star pins, and transferring heat from the third component to a cooling fluid in the second fluid cavity.

Another embodiment of the invention is a method of forming a heat dissipation device that comprises providing a first planar monolith of heat conducting material, forming an array of star pins by positioning an array of overlapping cylindrical bores in a first surface of the first monolith, where each star pin has concave faces and sharp edges, forming a truncated dimple at the bottom of each bore, providing a second planar component corresponding to the first monolith, coupling the second planar component to the first surface of the first monolith to form a fluid cavity, and forming a fluid inlet and a fluid outlet fluidly coupled to the fluid cavity.

Another aspect of the invention is forming the array of cylindrical bores in the first surface of the first monolith with a drill, and forming the truncated dimples with the drill.

A further aspect of the invention is forming truncated dimples in a first surface of the second planar component, where the truncated dimples in the first surface of the second planar component are positioned to correspond to the star pins in the first surface of the first monolith, and coupling the first surface of the second planar component to the first surface of the first monolith to form a fluid cavity.

A still further aspect of the invention is omitting a plurality of adjacent bores in the first surface of the first monolith thereby forming chambers.

Another aspect of the invention is where the second planar component comprises a second monolith of heat conducting material, forming an array of star pins by positioning an array of overlapping cylindrical bores in a first surface of the second monolith, and coupling the first surface of the first monolith to the first surface of the second monolith to form a fluid cavity.

A further aspect of the invention is positioning the star pins on the second monolith to align with the bores on the first monolith, and coupling the first surface of the first monolith to the first surface of the second monolith so that the star pins on the second monolith extend into the bores on the first monolith.

A still further aspect of the invention is omitting a plurality of adjacent bores in the first surface of the first monolith thereby forming chambers, and removing adjacent star pins in the first surface of the second monolith corresponding to the omitted bores.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus generally shown in FIG. 1A through FIG. 17. It will be appreciated that the apparatus may vary as to configuration and as to details of the parts, and that the method may vary as to the specific steps and sequence, without departing from the basic concepts as disclosed herein.

For liquid heat exchangers, increased surface area at the fluid interface surface and turbulent flow are desired for improved heat transfer. However, turbulent flow restricts fluid flow decreasing overall efficiency. Thus a balance of turbulent flow for heat transfer and laminar flow for fluid flow is desired. A heat transfer surface having pins perpendicular to the flow increases surface area and turbulent flow and is commonly used in a heat dissipating device.

Figure 1C:
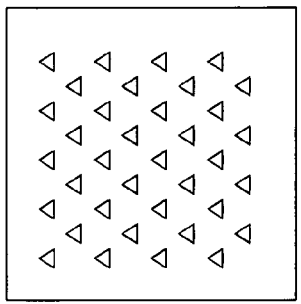
FIG. 1A through FIG. 1I illustrate top views of pin patterns used for heat dissipating devices in the known art designed to create turbulent flow around the pin for increased heat transfer efficiency.
Figure 1F:
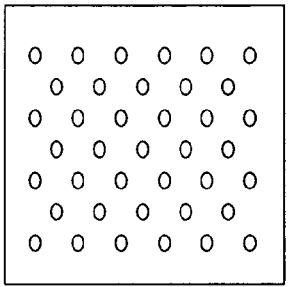
Figure 1I:
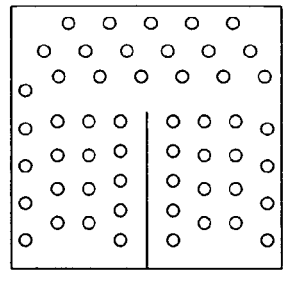
Figure 1B:
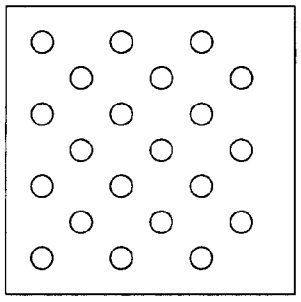
Figure 1E:
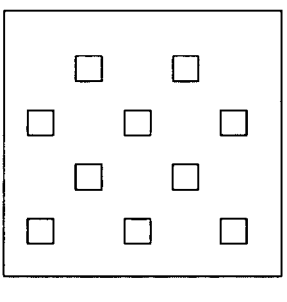
Figure 1H:
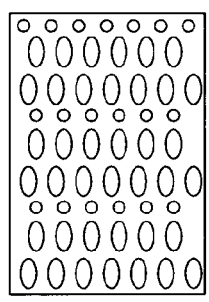
Figure 1A:
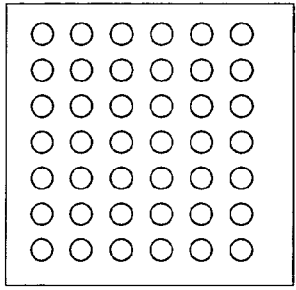
Figure 1D:
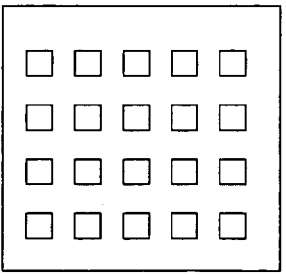

FIG. 1A through FIG. 1I illustrate top views of pin patterns used for heat dissipating devices in the known art designed to create turbulent flow around the pin for increased heat transfer efficiency. FIG. 1A shows circular pins in a tightly aligned array, FIG. 1B shows circular pins in a staggered array and FIG. 1C shows aligned triangular pins. FIG. 1D shows rectangular pins in tightly aligned array and FIG. 1E shows rectangular pins in a staggered array. A high density of pins with sharp edges increases turbulence but reduces fluid flow dramatically. When pin spacing is increased, the turbulence at the pin is reduced substantially thereby reducing heat transfer efficiency.

Figure 1G:
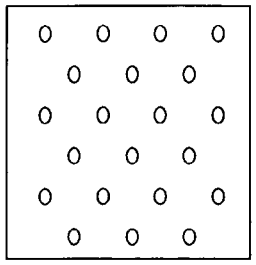

FIG. 1F shows an array of pins with elliptical cross sections to induce laminar flow between pins for increased fluid flow. FIG. 1G shows a staggered diamonds geometry to balance turbulent and laminar flow. FIG. 1H shows a hybrid alignment of circular and elliptical pins configured to induce turbulent flow at the circular pins and laminar flow between elliptical pins.

FIG. 1I shows a two pass configuration with circular pins arranged in a radial pattern at the bend to lower turbulence and increase fluid flow. All the pin designs in these views exhibit relatively average to poor heat transfer coefficients.

Figure 2J:
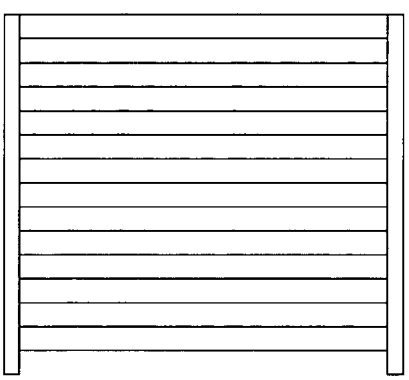
FIG. 2J through FIG. 2M illustrate cross section views of heat dissipation devices known in the art.
Figure 2K:
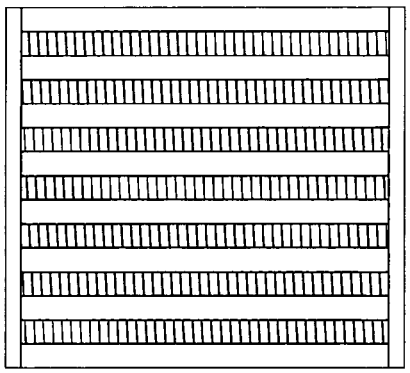

FIG. 2J through FIG. 2M illustrate cross section views of heat dissipation devices known in the art. FIG. 2J illustrates a typical pin configuration where the bottom surface of the heat dissipating device is coupled to the heat source and fluid flows horizontally between the pins. FIG. 2K illustrates adding texture to the pins, such as using threaded pins, to increase turbulent flow around the pins. Note that when pin heights are increased past optimal lengths, the increase in heat transfer for the added length falls off exponentially.

Figure 2L:
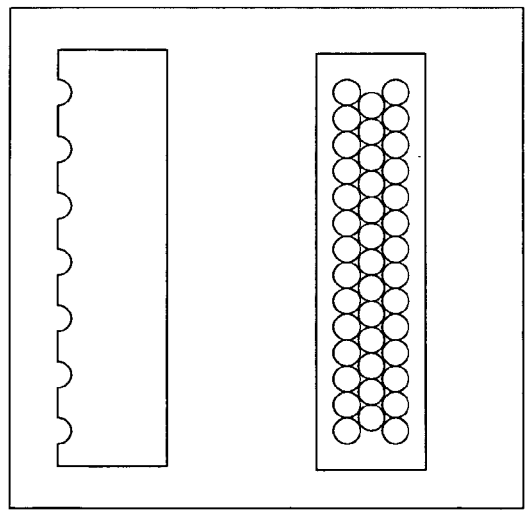
Figure 2M:
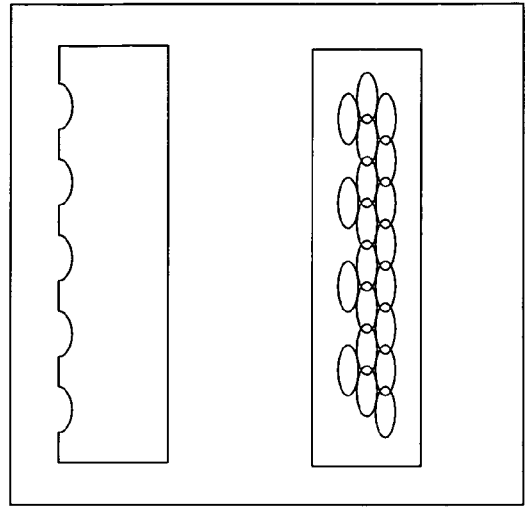

FIG. 2L shows positioning round dimples on the flat fluid interface surface to increase turbulent flow and surface area. FIG. 2M shows elongated staggered dimples on the fluid interface surface. In these designs, a vortex of fluid flow is formed at the dimple. The vortex is relatively inefficient, however and not adequate to provide a viable mechanism for efficient heat transfer in heat dissipation devices. Furthermore, deeper dimples further retard the desired vortex effect as the increased depth decreases turbulence creating stagnant fluid which ultimately decreases heat transfer. Deep dimples do increase the surface area of exposure to fluid, but for flow across the surface, the geometry actually reduces turbulence so that there is actually substantially less efficiency compared to shallow dimples.

Figure 3:
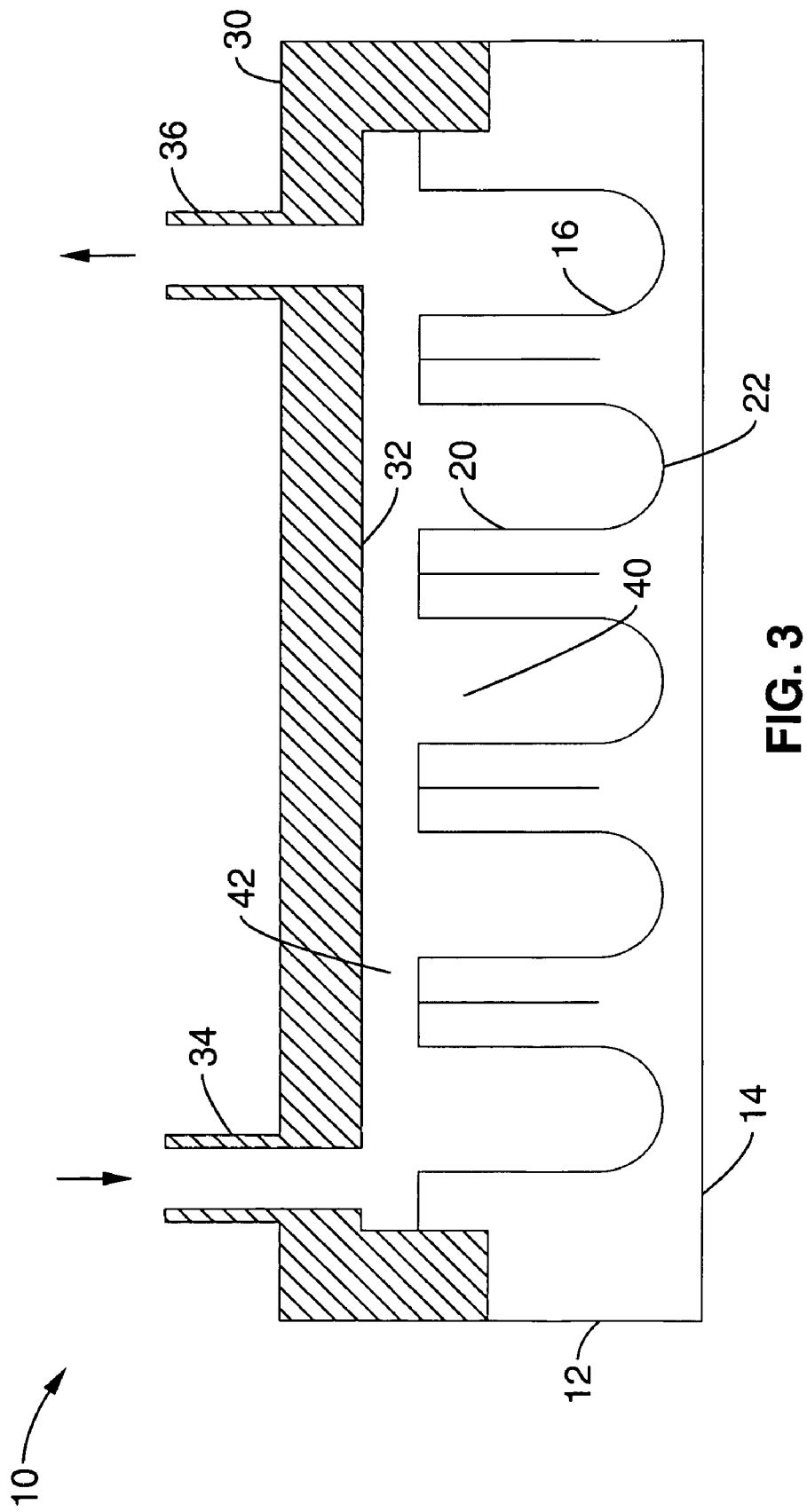
FIG. 3 illustrates a cross section view of a hybrid pin and dimple heat dissipation device according to the invention.

FIG. 3 illustrates a cross section view of an embodiment of a hybrid pin and dimple heat dissipation device 10 according to the invention. Heat dissipation device 10 has a base component 12 made of a conducting material such as metal. Base component 12 has a flat outside surface 14 that is typically coupled directly to a heat generating source such as a microprocessor (not shown). The thermal coupling of surface 14 to the heat source can be enhanced by soldering, brazing, welding or thermally efficient bonding such as the use of thermal grease, adhesive or application of pressure. Heat is typically transferred from the heat generating source through surface 14 to base component 12 via conduction.

Base component 12 has base fluid interface surface 16. In this illustration, non-circular pins 20 are positioned in an array equidistant between circular truncated dimples 22 on surface 16. The cross sectional geometry of pins 20 are generally polygons with smooth concave vertical faces and sharp edges also referred to as star pins. The cross section geometry of star pins 20 will be further illustrated in FIG. 7 through FIG. 11. Base component 12 with star pins 20 is typically produced from a monolith of metal, or star pins 20 can be separately manufactured and fastened to base component 12. It is typically more thermally efficient to machine base component 12 from a monolith block of heat conducting metal.

Top component 30 has top fluid interface surface 32, fluid inlet 34 and fluid outlet 36 and couples to base component 12 to form a fluid cavity 40. In the illustrated embodiment, there is a space 42 between top fluid interface surface 32 and the top of star pins 20. In operation, fluid flows from fluid inlet 34 horizontally through fluid cavity 40 to fluid outlet 36. Cooling fluid is typically water, oil, or mixture of liquid compounds.

Applying truncated dimples to fluid interface surface 16 create a vortex phenomenon in a perpendicular direction of fluid flow transmission. This process increases the heat transfer along local pins which are located around each truncated dimple. This effect allows the use of taller pins than prior art thus increasing the surface of heat transfer. These pins have a more efficient heat transfer coefficient along the total length of the pin, not possible with prior art.

Star pins with sharp edges prevent the distortion of the highly efficient vortex flow which increases fluid flow and simultaneously intensifies the desired phenomena of extraordinary turbulence. Concave smooth faces on each star pin create conditions for increasing the spiraling vortex over dimples, which in turn also improves heat dissipation characteristics of the heat exchanger.

Hybrid star pin fin heat exchanger device 10, with star pins 20 having concave faces and sharp edges along with the adjacent truncated dimples 22, increases the heat transfer coefficient while concurrently increasing the surface of efficient heat transfer and reducing the pressure drop observed in the fluid flow rate of the system.

Space 42 between top fluid interface surface 32 and the top of pins 20 can be adjusted from no separation to sufficient separation to allow diffusion of the vertical vortices against surface 32 without inducing significant horizontal laminar flow. The optimum separation will vary based on the geometry of the star pin array and the viscosity of the cooling fluid used.

A less preferred embodiment of heat dissipation device 10 can be constructed by positioning star pins 20 on surface 16 of base component 12 but positioning truncated dimples 22 on surface 32 of top component 30.

Star pins 20 are illustrated as positioned perpendicular to the flow of cooling fluid but can be positioned at other angles to the direction of flow. Star pins 20 could also have other vertical geometries such as a truncated pyramid.

Figure 4:
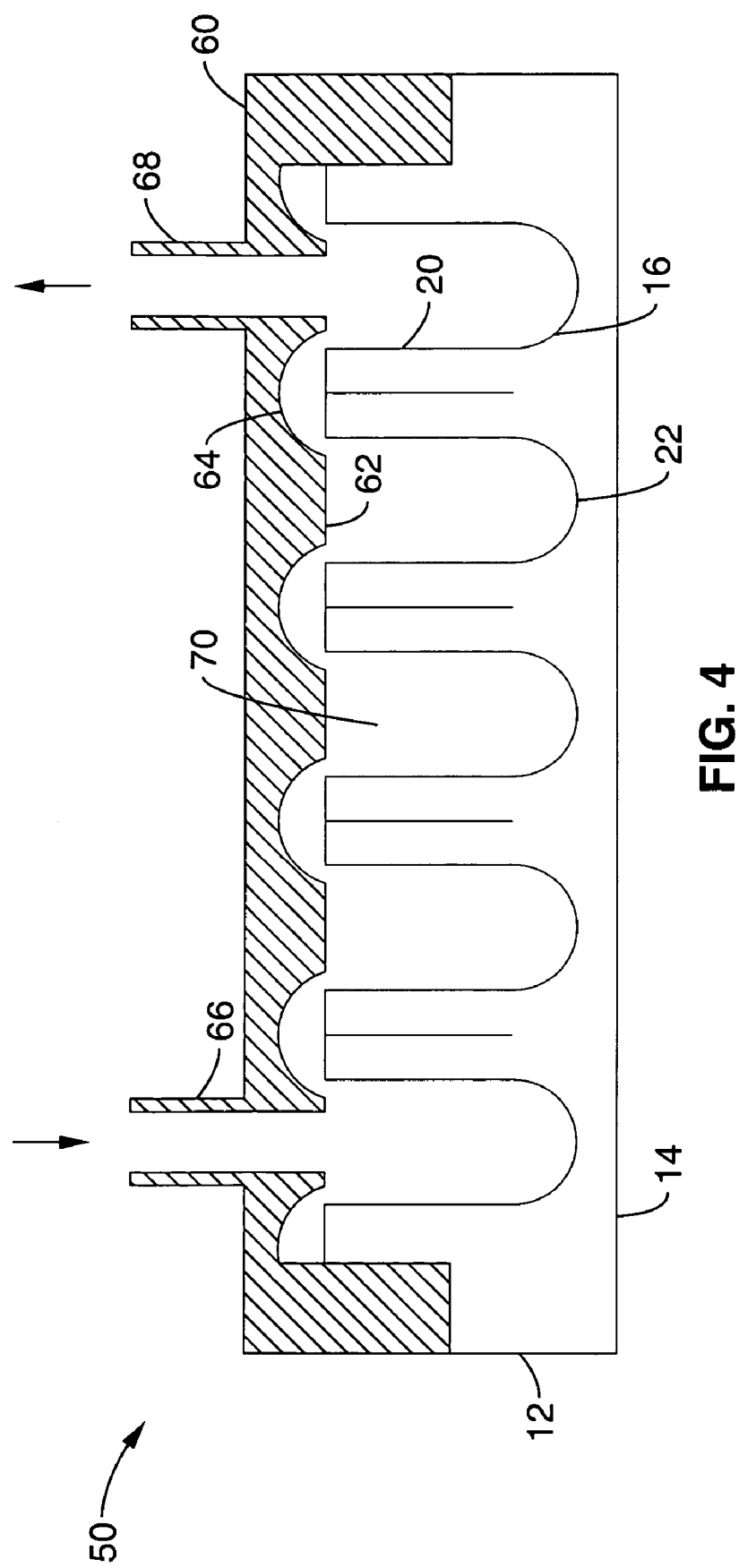
FIG. 4 illustrates a cross section view of another embodiment of a heat dissipation device according to the invention.

FIG. 4 illustrates a cross section view of another embodiment of a heat dissipation device 50 according to the invention. Base component 12 has a geometry as shown in FIG. 3 with thermal coupling surface 14 and base fluid interface surface 16. Star pins 20 with concave vertical faces and sharp edges are positioned in an array equidistant between circular truncated dimples 22 on surface 16. Top component 60 has fluid interface surface 62 with an array of circular truncated dimples 64 positioned above star pins 20. Top component 60 has fluid inlet 66 and fluid outlet 68 that are fluidly connected to a fluid cavity 70 formed by coupling top component 60 to base component 12.

In this embodiment, the fluid flow is horizontal from inlet 66 to outlet 68 in fluid cavity 70. Vortices formed in dimples 22 cause vertical turbulization along the concave vertical faces of star pins 20. Dimples 64 in top component 60 amplify the turbulization at the exchanger surfaces on the adjacent parallel star pins 20 that protrude perpendicular to the surface plane of base component 12. This amplified turbulization increases the heat exchange efficiency on all surfaces of star pins 20 and bottom component 12.

Figure 5:
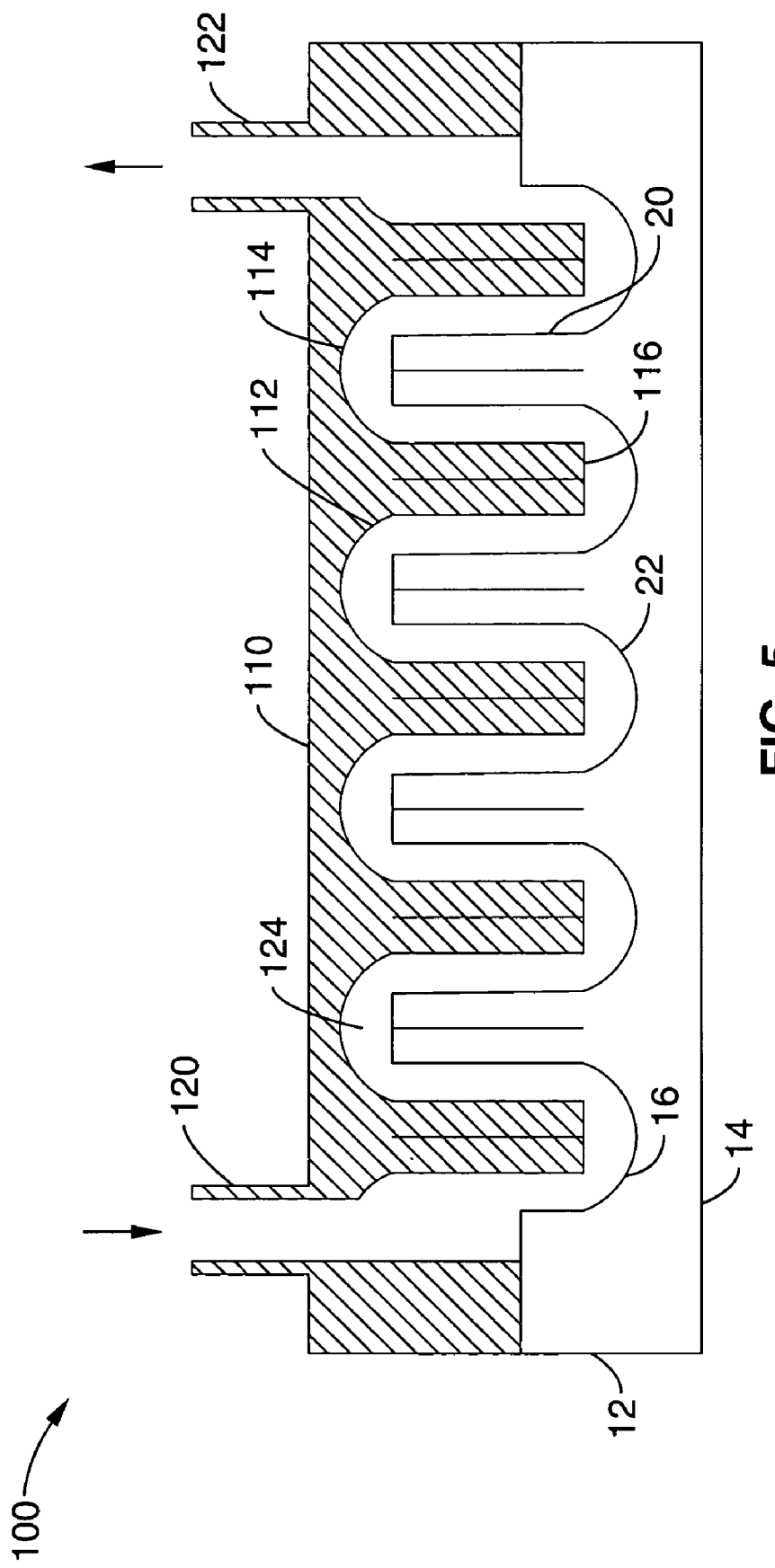
FIG. 5 illustrates a cross section view of a further embodiment of a heat dissipation device according to the invention.

FIG. 5 illustrates a cross section view of a further embodiment of a heat dissipation device 100 according to the invention. Base component 12 has thermal coupling surface 14 and base fluid interface surface 16. Perpendicular star pins 20 with concave vertical faces and sharp edges are positioned in an array equidistant between circular truncated dimples 22 on surface 16. Top component 110 has top fluid interface surface 112 with an array of circular truncated dimples 114 aligned above star pins 20 and an array of top star pins 116 aligned above dimples 22. Top component 110 has fluid inlet 120 and fluid outlet 122 that are fluidly connected to a fluid cavity 124 formed by coupling top component 110 to base component 12. Both top component 110 and base component 12 are typically made from a monolith block of metal.

In this embodiment, the fluid flow is horizontal from inlet 120 to outlet 122 in fluid chamber 124. The parallel heat exchanger surfaces, which incorporate star pins, are precisely coupled in a manner such that star pins emerging from one plane do not directly attach to the surface of the opposing mated parallel plane. The pins emerging from one plane stop some distance short of the opposing parallel plane's dimple surface.

In another mode of this embodiment, a second heat source is coupled to top component 110 and heat is dissipated from the top and bottom.

Figure 6:
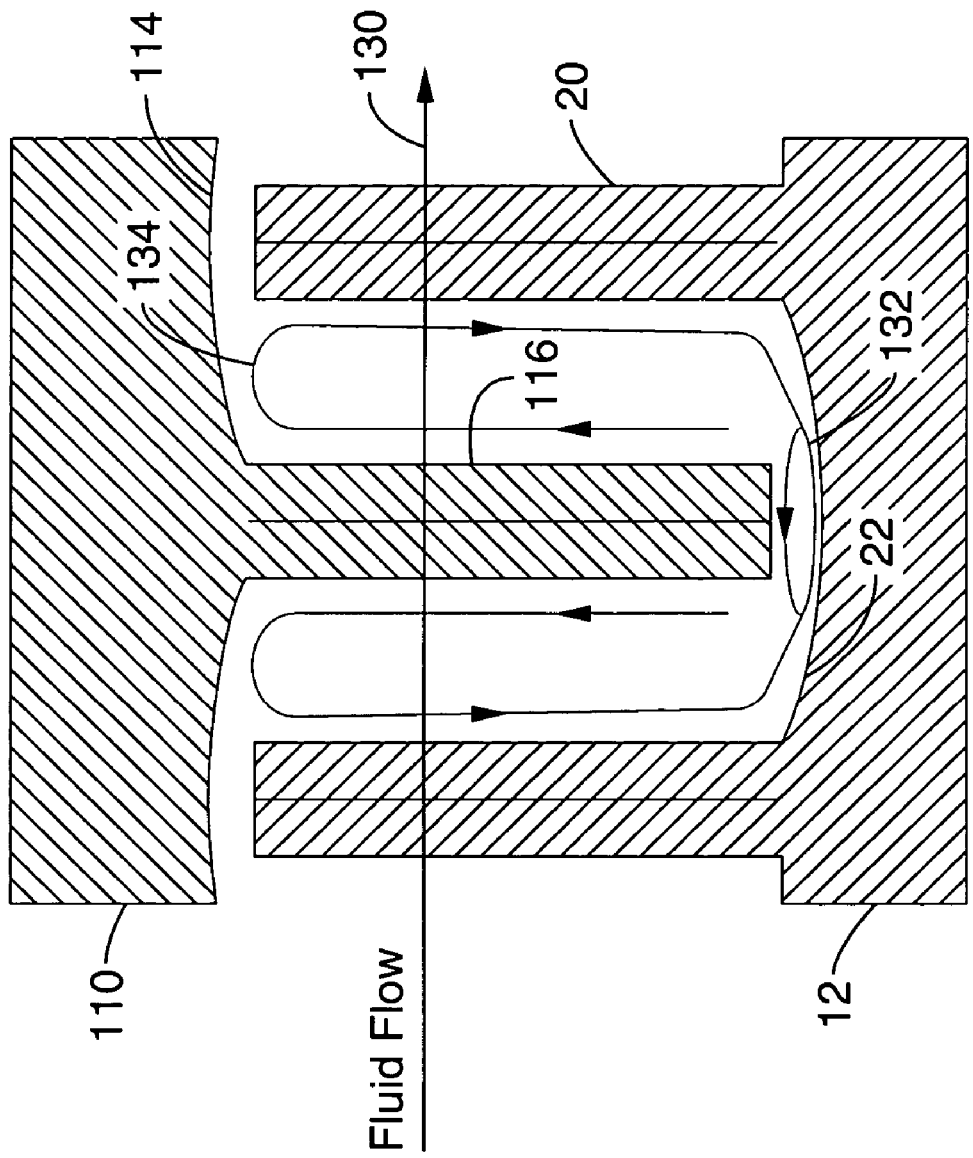
FIG. 6 is a close up schematic view of the heat dissipation device shown in FIG. 5 to illustrate flow patterns that develops from the hybrid star pin and dimple configuration.

FIG. 6 is a close up schematic view of the heat dissipation device 100 shown in FIG. 5 to illustrate flow patterns that develops from the hybrid star pin and dimple configuration. In this example, fluid flows from left to right as depicted by arrow 130.

As the fluid moves past a star pin, unique turbulence is created which causes this turbulization phenomenon to rise in a plane horizontal to the exchanger's base. As the fluid passes over truncated dimples 22 between the base and top star pins 116, an extraordinary turbulent phenomenon 132 occurs propelling the fluid in a vertical direction 134 perpendicular to base component 12 and parallel to bottom star pins 20 and top star pins 116. The cooling liquid travels down into the truncated dimples 22 which have a stable characteristic so that there are consistent points of bifurcation and diffusion. This vertical turbulization 134 is formed in an interval between star pins 116 above the base truncated dimples 22. The geometry of star pins 116 on the top side of heat sink device 100 enhance the vertical component of this turbulization 134 that essentially increases the heat transfer coefficient along both star pins 22 and top star pins 116.

The truncated top dimples 114 on top component 110 are positioned directly over top star pins 116 which protrude perpendicular to the top fluid interface surface 112. These top dimples 114 and top star pins 116 amplify the turbulization at base surface 14 and on the adjacent parallel star pins 20 that protrude from base component 12. This in turn strongly increases the turbulization and heat exchanger efficiencies on all surfaces of the heat exchanger 12.

Star pins with sharp edges prevent the distortion of the highly efficient vortex flow which increases fluid transfer to the liquid and intensifies the desired phenomena of extraordinary turbulence creating more efficient heat exchange. Concave smooth surfaces on each star pin create conditions for increasing of the spiraling vortex over dimples, which in turn improves heat dissipation characteristics of the heat exchanger.

Figure 7:
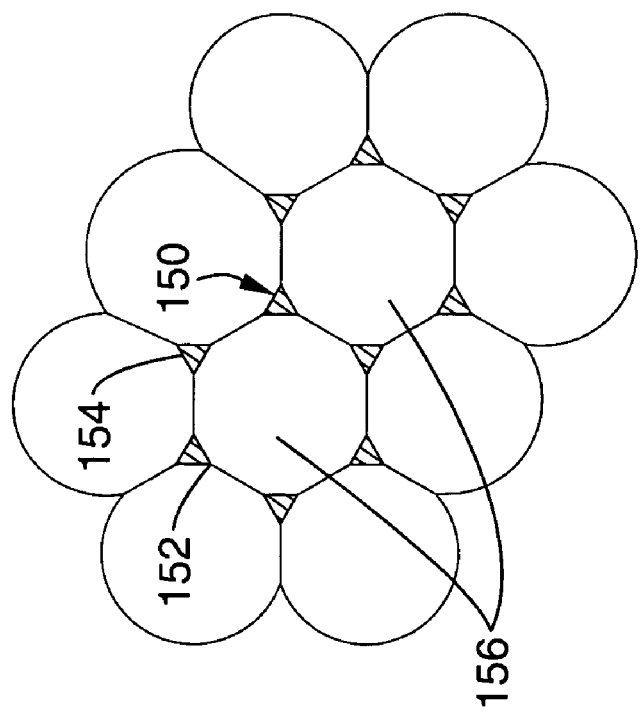
FIG. 7 illustrates a plan view of a hybrid dimple and star pin array where the star pins have three vertical concave faces.

FIG. 7 illustrates a plan view of a hybrid dimple and star pin array on a fluid interface surface according to an embodiment of the invention. Star pin 150 has a triangular cross section with three sharp edges 152 and three concave faces or vertical surfaces 154. A truncated dimple 156 is positioned at each face 154 such that there are six star pins 150 on the circumference of each dimple 156. As will be illustrated in FIG. 9, the diameters of truncated dimples 156 do not need to be uniform.

One method of producing star pins 150 is to create adjacent overlapping bores that align with truncated dimples 156 with a drill. A drill bit with a conical cutting edge can be used to form both the cylindrical bore and truncated dimple 156.

Figure 8:
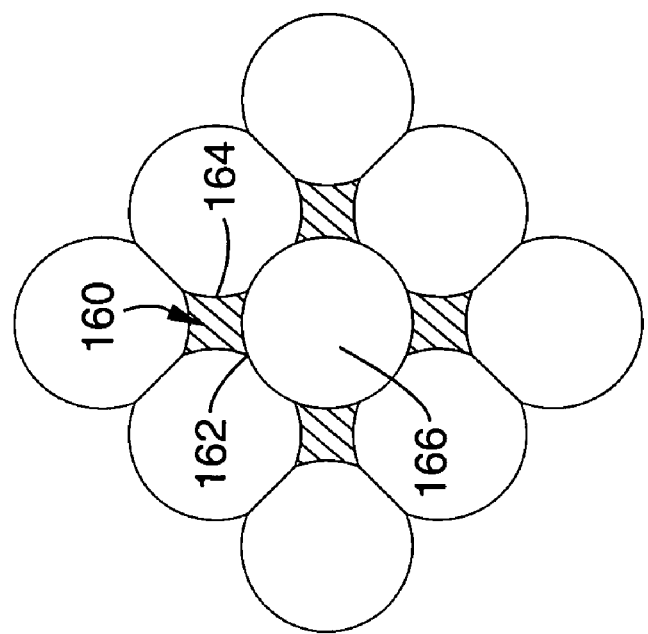
FIG. 8 illustrates a plan view of another embodiment where star pins have a square cross section with four sharp edges and four concave faces.

FIG. 8 illustrates a plan view of another embodiment of a dimple and star pin array. Star pin 160 has a square cross section with four sharp edges 162 and four concave faces 164. A truncated dimple 166 is positioned at each face such that there are four star pins 160 on the circumference of each dimple 166.

Figure 9:
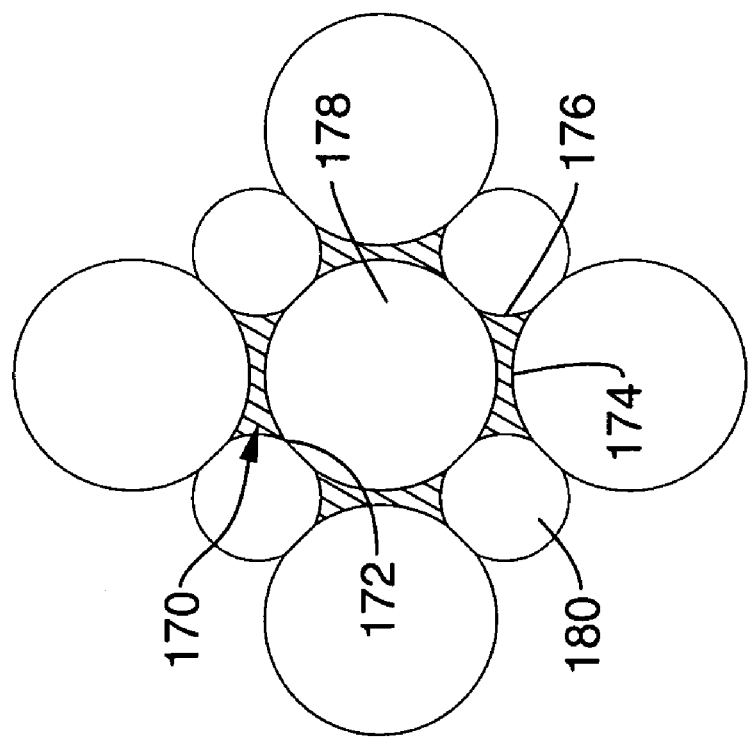
FIG. 9 illustrates a plan view of a further embodiment of a dimple and star pin array where the star pins have a rectangular cross section with two wide concave faces and two narrow concave faces.

FIG. 9 illustrates a plan view of a further embodiment of a dimple and star pin array. Star pin 170 has a rectangular cross section with four sharp edges 172 and two wide concave faces 174 and two narrow concave faces 176. A large diameter truncated dimple 178 is positioned adjacent each wide face 174 and a smaller diameter truncated dimple 180 is positioned at each narrow face 176. There are four star pins 170 on the circumference of each large dimple 178 and on the circumference of each small dimple 180. Further, each large diameter dimple 178 has four smaller diameter dimples 178 on its circumference.

Figure 10:
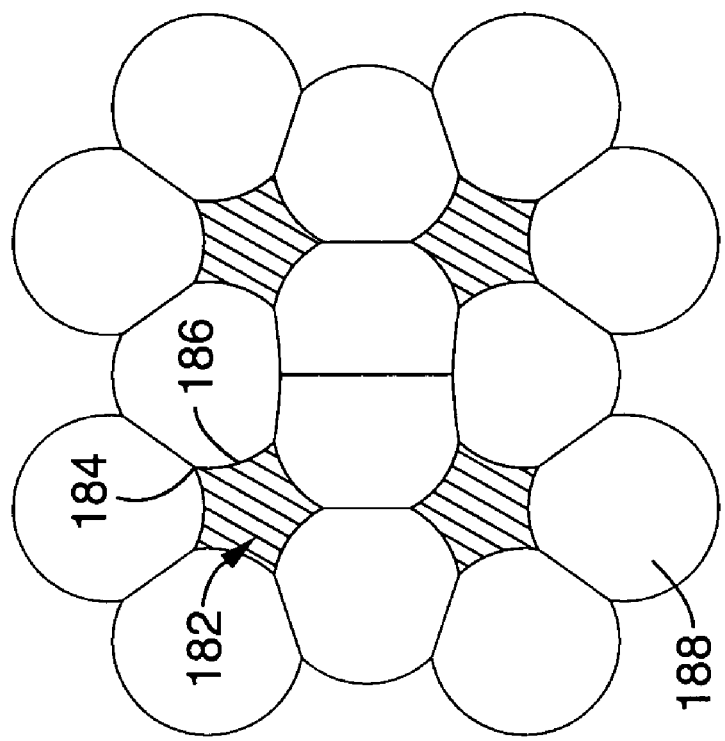
FIG. 10 illustrates a plan view of a still further embodiment of a dimple and star pin array where star pins have the cross section of a five point star.

FIG. 10 illustrates a plan view of a still further embodiment of a dimple and star pin array. Star pin 182 has the cross section of a five point star with sharp edges 184 and concave vertical faces 186. Truncated dimples 188 are positioned at each face 186 of star pin 182. In order to form an aligned array of star pins 182, the circumferences of truncated dimples 188 are overlapped to varying degrees.

Figure 11:
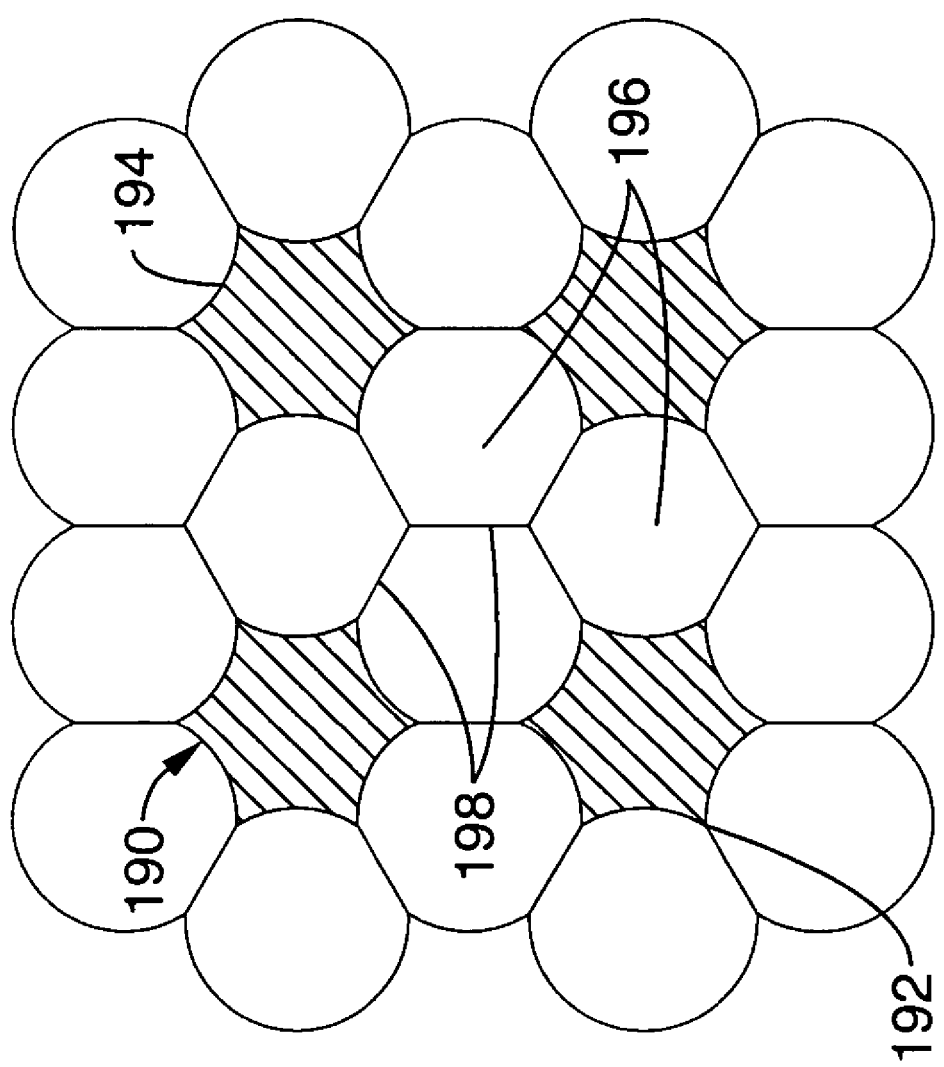
FIG. 11 illustrates a plan view of another embodiment of a hybrid dimple and star pin array where star pins have the cross section of a six point star.

FIG. 11 illustrates a plan view of a still further embodiment of a hybrid dimple and star pin array. Star pin 190 has the cross section of a six point star with sharp edges 194 and concave vertical faces 196. Truncated dimples 198 are positioned at each face 196 of star pin 192. In order to form an aligned array of star pins 192, circumferences of dimples 198 are overlapped.

Star pins with other geometries of concave faces or arrayed with other combinations of truncated dimples can also be applied without departing from the teachings of the invention. Truncated dimples are illustrated as round but may be applied with an elliptical shape.

The top of the star pins can also have a specific geometry. In one embodiment, the top is flat. In other embodiments, the top is conical, concave or convex.

Figure 13:
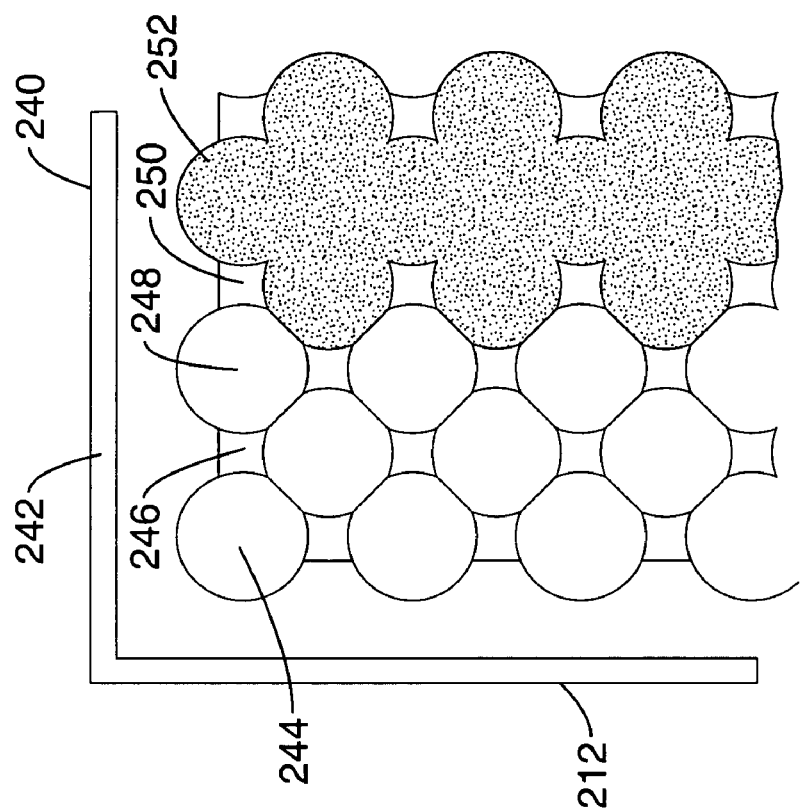
FIG. 13 is a top view of a top component configured to mate with the base component shown in FIG. 12.
Figure 12:
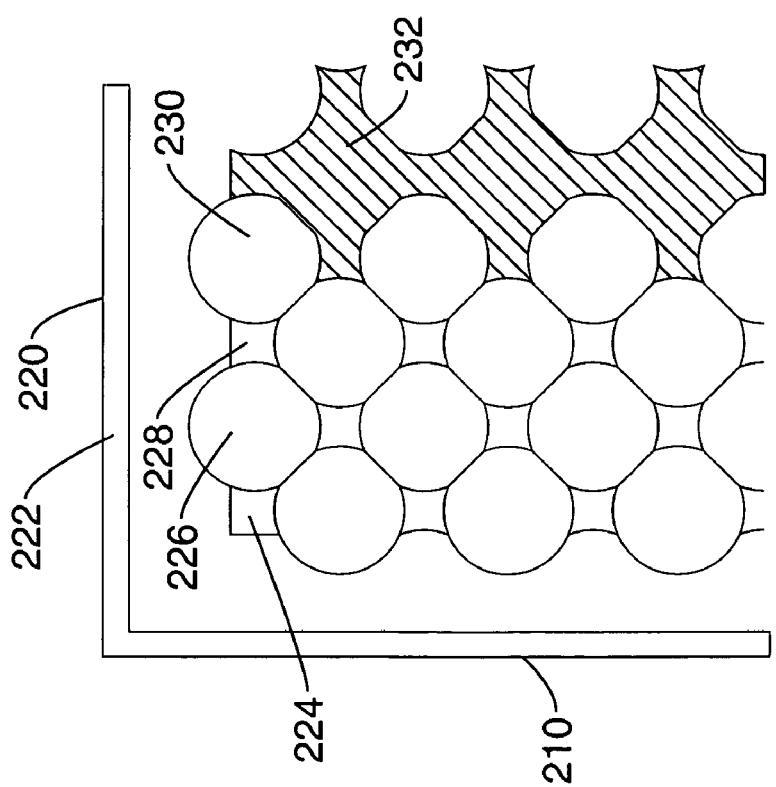
FIG. 12 is a top view of a base component with star pins and dimples laid out in a regular spaced rows and columns.

FIG. 12 is a top view of a base component 210 and FIG. 13 is a top view of a top component 212 configured to mate with base component 210. Starting with FIG. 12, base component has a rectangular perimeter 220 with a beveled edge 222. Star pins and dimples are laid out in a regular spaced rows and columns. In the upper left corner, is a four sided star pin 224 then to the right an adjacent dimple 226 then an adjacent star pin 228 and an adjacent dimple 230. Adjacent to dimple 230, a protrusion 232 has been formed by omitting (not forming) an aligned column of bores. This protrusion can be used to channel fluid flow or index assembly with top component 212.

In FIG. 13, the corresponding top component 212 (as seen from the top) has a rectangular perimeter 240 with a raised lip 242 that mates with beveled edge 222 in FIG. 12. Typically these edges would be coupled and sealed together by welding, brazing, soldering, caulking, gluing or other fluid tight bonding method.

In the upper left corner is a dimple 244 that corresponds to star pin 224 on base component 210. Moving to the right is a star pin 246 that corresponds to dimple 226, a dimple 248 that corresponds to star pin 228 and a star pin 250 that corresponds to dimple 230. Adjacent to star pin 228 is a recess 252 formed by removing a column of star pins. Recess 252 corresponds to protrusion 232 and allows this section of top component 212 to mate exactly with the corresponding section of base component 210. The surfaces of protrusion 232 and recess 252 do not need to mate flush to form an effective channel for horizontal fluid flow. Thus the dimples can be retained in recess 252.

Figure 14:
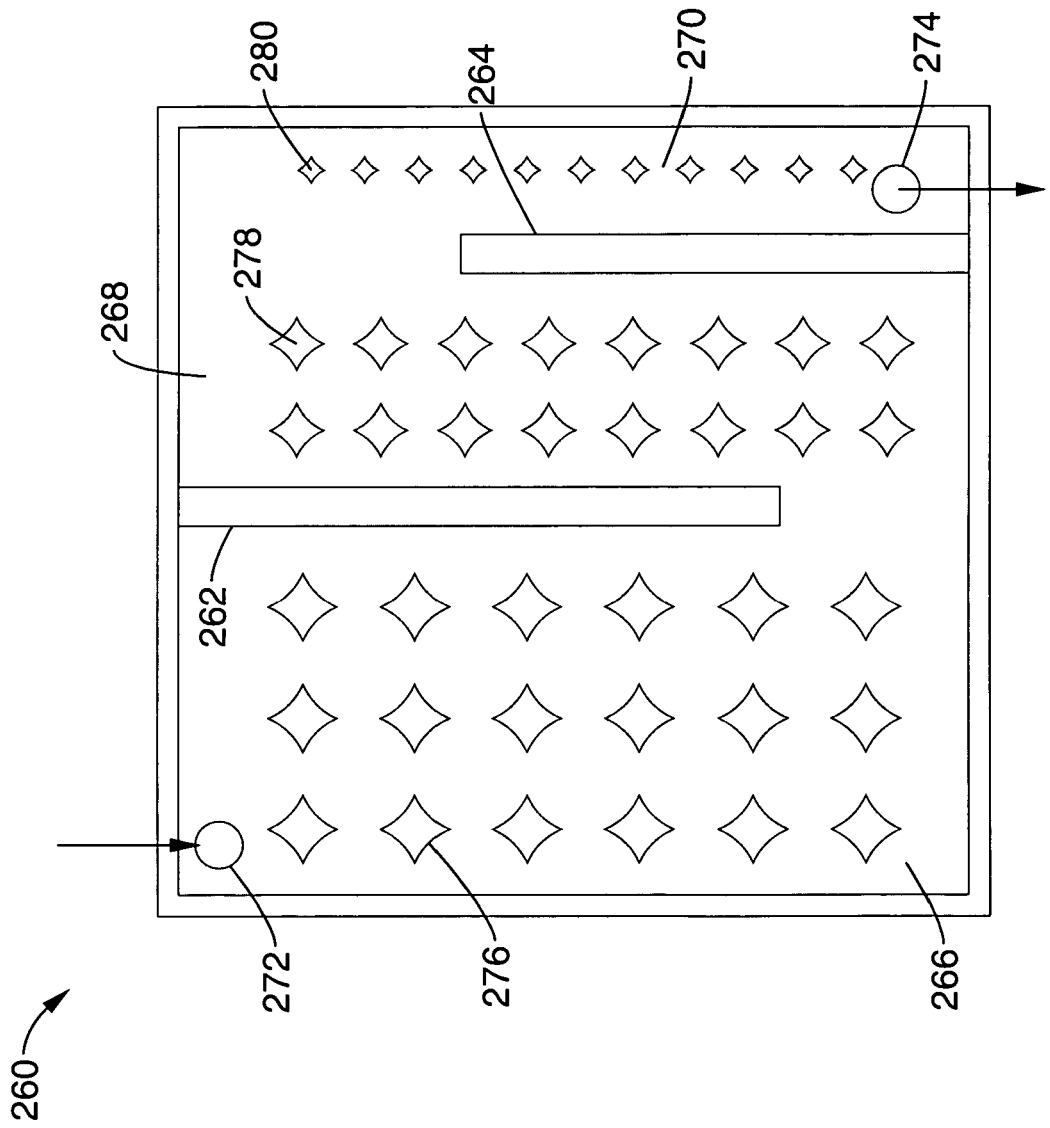
FIG. 14 is a top view of a multi-chambered heat dissipation device according to an embodiment of the invention.

FIG. 14 is a top view of a multi-chambered heat dissipation device 260. In this embodiment of the invention, a first vertical wall 262 and second vertical wall 264 are formed independent of dimples and star pins. A first chamber 266 is defined by first wall 264 and the perimeter of device 260. A second chamber 268 is defined by first, second wall 264, 266 and the device perimeter and third chamber 270 is defined by second wall 266 and the perimeter of device 260. In this illustration, a fluid inlet 272 is connected to first chamber 266 and fluid outlet 274 is connected to third chamber 270 so that fluid is channeled through the three chambers in series. An array of star pins and dimples are positioned in each chamber. Note that star pins 276 and corresponding dimples in first chamber 266 can be a different size or configuration than star pins 278 in second chamber 268 or star pins 280 in third chamber 270. Each chamber may be configured differently depending upon desired fluid flow or heat transfer from that chamber. Each chamber may have a different geometry or size of star pins and/or truncated dimples depending on desired fluid flow or heat transfer for that chamber. Each chamber may be specifically configured with a star-pin configuration to address localized heat transfer from the heat source. The specific configuration of the chamber components and chamber size is made to control the velocity of fluid and pressure of fluid in a chamber to specifically address local heat transfer requirements.

Figure 15:
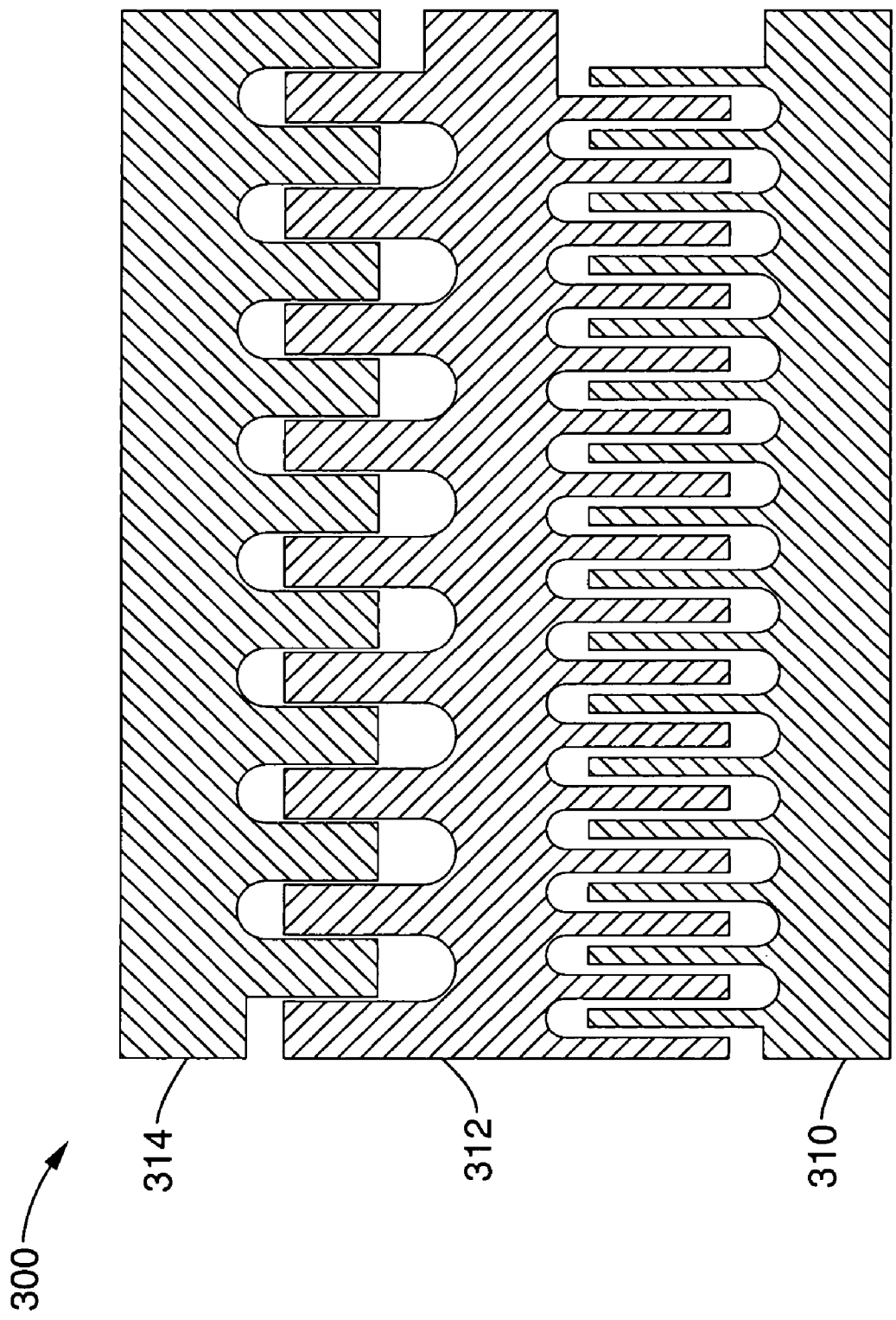
FIG. 15 is a cross section view of a multilayer heat dissipation device according to an embodiment of the invention.

FIG. 15 is a cross section view of a multilayer heat dissipation device 300. Base component 310 has a hybrid star pin and dimple configuration for the heat source coupled to base component 310. Middle component 312 has the mating configuration for base component 310 and a mating star pin and dimple configuration for top component 314. For this embodiment, the star-pin geometries and chamber configurations may be the same as a single layer device where middle component 312 will have a matrix of star-pins that mesh with the opposing matrix of star-pins in base component 310 and top component 314 to form the multi-layered chambers. In one mode of this embodiment, a second heat source is coupled to top component 314. The multilayer chambers may be fluidly coupled in series flow, parallel flow or operated independently.

Figure 16:
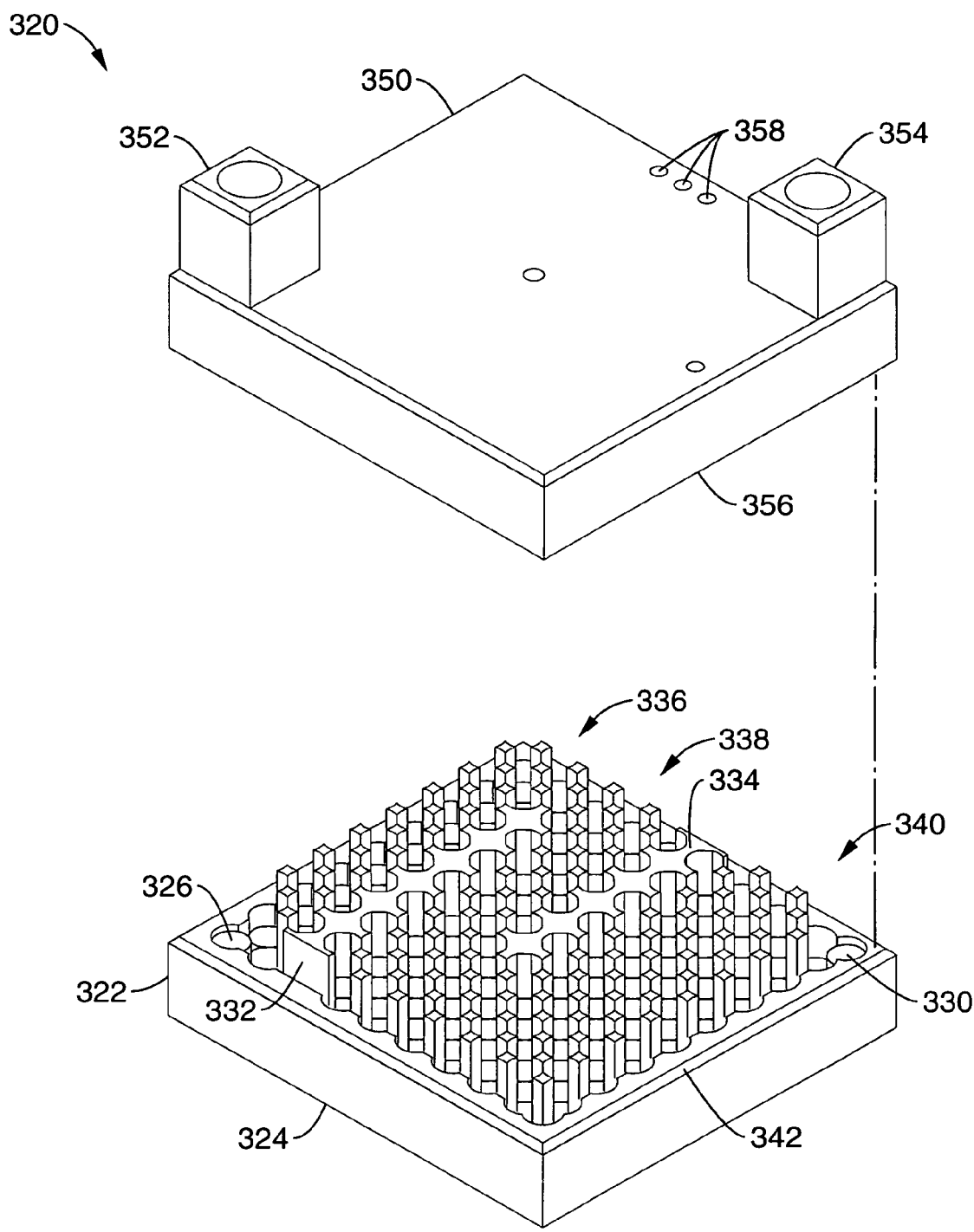
FIG. 16 is an isometric view of a heat dissipation device according to an embodiment of the invention.

FIG. 16 is an isometric view of a heat dissipation device 320 according to an embodiment of the invention. Base component 322 is rectangular shaped with a bottom surface 324 adapted to couple to a heat generating device and a fluid interface surface 326. An array of four sided star pins 328 and truncated dimples 330 are positioned on fluid interface surface 326. A first and second protrusion 332, 334 divide base component 322 into first, second and third serpentine chambers 336, 338, 340 respectively. First and second protrusions 332, 334 are formed by not boring a column of dimples as discussed previously in FIG. 12.

The perimeter of base component 322 has a beveled edge 342. In an exemplary embodiment, base component 322 is formed from a monolith of metal and measures about 2.5 inches square and about 0.5 inches high including the height of star pins 328. Star pins 328 are about 0.125 inches high but could be from about 0.1 inches to about 2 inches high. Star pins 328 are about 0.065 inches thick but could be from about 0.02 inches to about 0.4 inches thick.

Truncated dimples 330 are about 0.125 inches deep and about 0.125 inches in diameter but could be from about 0.005 to about 0.2 inches deep and from about 0.02 inches to about 0.2 inches in diameter.

Top component 350 is rectangular and adapted to mate with base component 322. A threaded fluid inlet 352 is positioned in one corner to correspond to the outer corner of first chamber 336 and a threaded fluid outlet 354 is positioned in the opposite corner to correspond to the outer corner of third chamber 340. As illustrated here, star pins have been removed at the corresponding locations of fluid inlet 352, and fluid outlet 354 to provide better inlet and outlet flow.

Top component 350 has a lip 356 adapted to mate with beveled edge 342 of base component 322. Apertures 358 are provided to coupled instrumentation such as temperature sensors.

In one mode of this embodiment, the inside surface of top component 350 is configured flat to form a fluid cavity as discussed previously in FIG. 3. In another mode, the inside surface of top component 350 has an array of dimples that correspond to star pins 328 and form a fluid cavity as discussed previously in FIG. 4. In a further mode, the inside surface of top component 350 has an array of star pins and dimples that correspond to star pins 328 and dimples 330 as discussed previously in FIG. 5 and recesses that correspond to first, second protrusions 332, 334 as discussed previously in FIG. 12 and FIG. 13. In an exemplary embodiment, top component 350 is formed from a monolith of heat conducting material such as metal.

Heat dissipation device 320 can have other shapes such as triangular, hexagonal, round or oval. In further embodiments, heat dissipation devices can have a three dimensional aspect such as a pyramid or cube to increase the total available area of heat dissipating surfaces.

Figure 17:
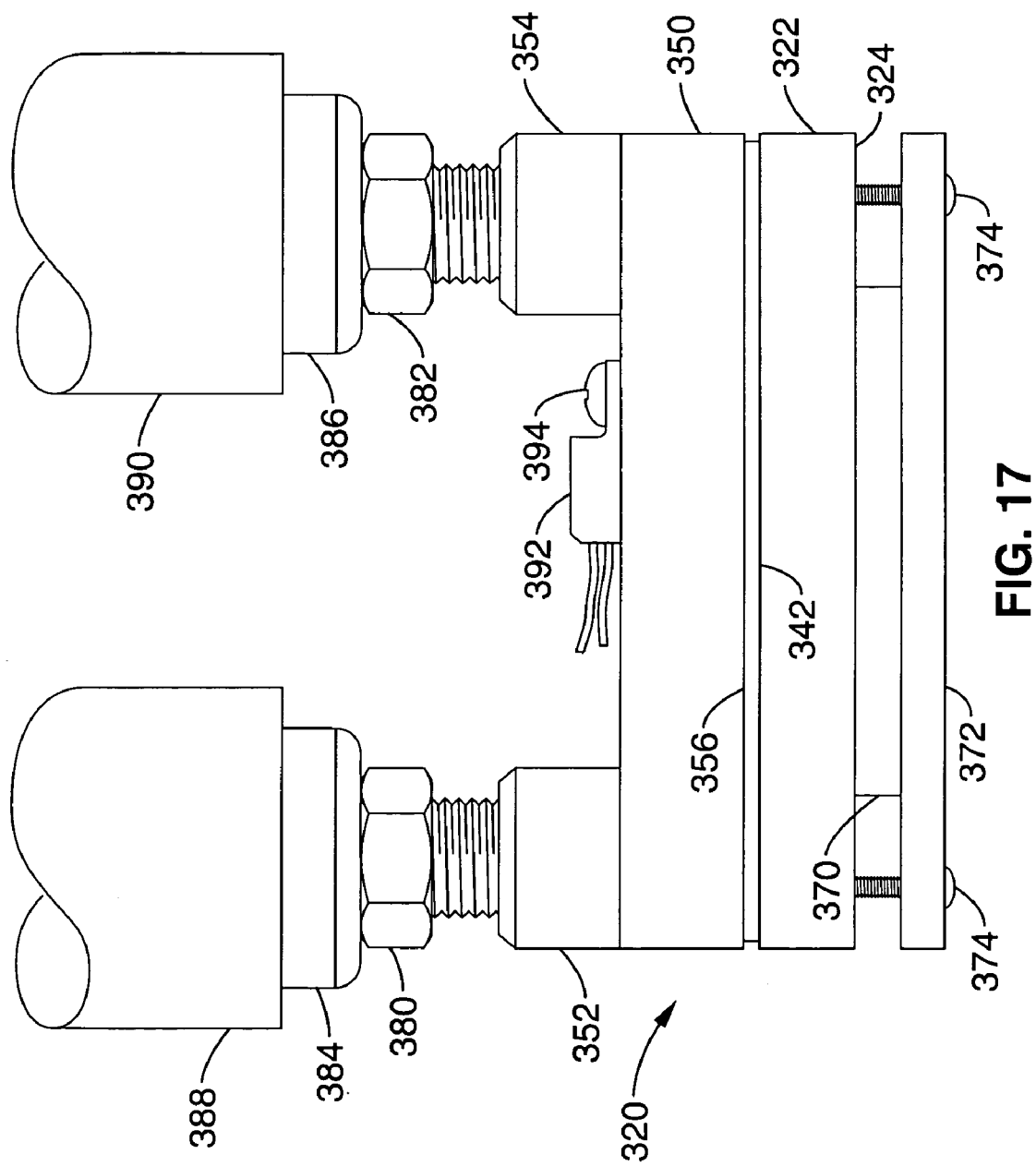
FIG. 17 illustrates a side view of the heat dissipation device shown in FIG. 16 assembled and configured for a heat dissipation application.

FIG. 17 illustrates a side view of heat dissipation device 320 shown in FIG. 16 assembled and configured for a heat dissipation application. Lip 356 of top component 350 is coupled to beveled edge 342 of base component 322 and sealed such as by welding, brazing, soldering, caulking, gluing or other fluid tight bonding method. A heat generating device 370, such as a microprocessor, is coupled to bottom surface 324 in a manner to facilitate heat conduction to bottom surface 324, such as applying a heat conducting grease. A substrate 372 supports heat conducting device 370 and could be a circuit board, a heat conducting plate or another heat dissipation device 320. Screws 374 are used to secure heat dissipation device 320 in place on substrate 372 and can be used to increase contact pressure between heat generating device 370 and bottom surface 234 to improve conduction.

Inlet, outlet fluid couplings 380, 382 are fluidly connected to fluid inlet 352 and fluid outlet 354. Inlet, outlet tubing 384, 386 are used to flow cooling fluid through heat dissipation device 320. Inlet, outlet outer sleeves 388, 390 can be used to provide insulation and protection to inlet, outlet tubing 384, 386. A thermal sensor 392, such as a thermocouple, is illustrated coupled to top component 350 by a screw 394 that can be used to increase contact pressure for better conduction.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A heat dissipation device, comprising:
a housing adapted to conduct heat from a heat source;
wherein said housing comprises a first component and a second component;
wherein a first fluid cavity is formed by coupling said first component and said second component;

an inlet port fluidly coupled to said first fluid cavity;
an outlet port fluidly coupled to said first fluid cavity;
wherein said first fluid cavity is adapted to flow cooling fluid from said inlet port to said outlet port;
an array of first star pins positioned in said first fluid cavity and coupled to said housing;
said first component having a surface at a base of said array of first pins;
wherein a cross section of said first star pins has at least three concave faces;
wherein an intersection of said concave faces on said first star pins form first edges;
an array of first dimples formed on said surface of said first component of said housing to be in said first fluid cavity and at least proximally located at said base of said array of first star pins;
said array of first star pins being coupled to said first component;
said array of first dimples being formed on said surface of said first component;
said first dimples being positioned between said first star pins;
an array of second dimples formed on a surface of said second component;
said second dimples being positioned to align with said first star pins on said first component;
first dimples of said array of first dimples and second dimples of said array of second dimples having concave up-facing surfaces and concave down-facing surfaces, respectively, formed in said surface of said first component of said housing and in said surface of said second component of said housing, respectively;
said concave up-facing surfaces being at least substantially perpendicular with respect to a bottom surface of said first component;
said concave down-facing surfaces being at least substantially perpendicular with respect to a top surface of said second component; and
said first star pins not touching said second component.

2. A heat dissipation device as recited in claim 1, wherein said first star pins are oriented perpendicular to the flow of cooling fluid in said first fluid cavity.

3. A heat dissipation device as recited in claim 1, wherein said first star pins have a cross section comprising four concave faces.

4. A heat dissipation device as recited in claim 1, further comprising:
an array of second star pins coupled to said second component;
wherein said second star pins are positioned in said first fluid cavity;
wherein said second star pins are further positioned to align with said first dimples in said first component; and
wherein said second star pins do not touch said first component.

5. A heat dissipation device as recited in claim 4:
wherein the cross section of said second star pins has at least three concave faces; and
wherein the intersection of said concave faces on said second star pins form sharp edges.

6. A heat dissipation device as recited in claim 4, wherein the cross section of said first star pins is the same geometry as the cross section of said second star pins.

7. A heat dissipation device as recited in claim 1, further comprising:
a plurality of chambers formed in said first fluid cavity;
wherein said plurality of chambers are fluidly coupled between said inlet port and said outlet port.

8. A heat dissipation device as recited in claim 1, wherein the perimeter of said first component is rectangular.

9. A heat dissipation device, comprising:
a first component having a first fluid interface and a first heat conducting surface;
wherein said first heat conducting surface is adapted to conduct heat from a heat source;
a second component having a second fluid interface;
wherein a first fluid cavity is formed by coupling said first fluid interface of said first component with said second fluid interface of said second component;
an inlet port fluidly coupled to said first fluid cavity;
an outlet port fluidly coupled to said first fluid cavity;
wherein said first fluid cavity is adapted to flow cooling fluid from said inlet port to said outlet port;
an array of first star pins coupled to said first fluid interface and positioned in said first fluid cavity;
wherein the cross section of said first star pins has at least three concave faces;
wherein the intersection of said concave faces on said first star pins form first edges;
an array of first dimples located on a first surface of said first fluid interface;
said first dimples having concave up-facing surface that are at least substantially perpendicular with respect to said first surface;
wherein said first dimples are at least proximally located at the base of said first star pins and are positioned between said first star pins;
an array of second dimples formed on a second surface of said second fluid interface;
said second dimples having concave down-facing surfaces that are at least substantially perpendicular with respect to said second surface;
said second dimples being positioned to align with said first star pins on said first fluid interface; and
said first star pins not touching said second fluid interface.

10. A heat dissipation device as recited in claim 9, further comprising:
an array of second star pins coupled to said second fluid interface;
wherein said second star pins are positioned to align with said first dimples in said first fluid interface; and
wherein said second star pins do not touch said first fluid interface.

11. A heat dissipation device as recited in claim 10;
wherein the cross section of said second star pins has at least three concave faces; and
wherein the intersection of said convex faces on said second star pins form second edges.

12. A heat dissipation device as recited in claim 9, comprising:
a plurality of chambers formed in said first fluid cavity;
wherein said plurality of chambers are fluidly coupled between said inlet port and said outlet port.

13. A heat dissipation device, comprising:
a housing defining a chamber;
the housing having an inlet and an outlet configured to allow for passage of fluid into and out of the chamber respectively via the inlet and the outlet;
first pins extending away from a first interior surface of the housing and into the chamber defined by the housing;
the first pins being spaced apart from one another for the passage of fluid therebetween;

the first interior surface of the housing defining a portion of the chamber;

the first interior surface of the housing having first dimples formed thereon;

the first dimples of the first interior surface being located between the first pins and being located at least proximal to a base of the first pins;

the first dimples formed with first concave surfaces facing away from and at least substantially perpendicular to the first interior surface;

the housing having a second interior surface defining another portion of the chamber;

first ends of the first pins being spaced apart from the second interior surface for the passage of fluid therebetween;

the housing including two pieces attached to one another to define the chamber;

a first piece of the two pieces including the first interior surface;

a second piece of the two pieces including the second interior surface;

the second interior surface of the housing having second dimples formed thereon;

the second dimples formed with second concave surfaces facing away from and at least substantially perpendicular to the second interior surface; and the first ends of the first pins being positioned for alignment with the second dimples of the second interior surface;

wherein the first ends of the first pins respectively at least generally face the second concave surfaces of the second dimples.

14. The heat dissipation device according to claim 13, wherein the inlet and the outlet are positioned to allow for passage of fluid into and out of the chamber respectively via the inlet and the outlet in at least a substantially collinear orientation with respect to vertical faces of the first pins.

15. The heat dissipation device according to claim 13, further comprising:

second pins extending from the second interior surface of the housing and into the chamber defined by the housing;

the second interior surface being positioned opposite the first interior surface for defining the chamber therebetween;

the second dimples of the second interior surface being located between the second pins and being located at least proximal to a base of the second pins where the second pins extended from the second interior surface and into the chamber defined by the housing;

second ends of the second pins being positioned for alignment with the first dimples of the first interior surface;

wherein the second ends of the second pins respectively at least generally face bottoms of the first concave surfaces of the first dimples;

the second ends of the second pins being spaced apart from the first interior surface for the passage of fluid therebetween; and facing portions of each of the first pins and the second pins interposed with one another defining interstices therebetween for the passage of fluid in the interstices.

16. The heat dissipation device according to claim 15, wherein the inlet and the outlet are positioned to allow for passage of fluid into and out of the chamber respectively via the inlet and the outlet in at least a substantially collinear orientation with respect to vertical faces of the first pins and the second pins.

* * * * *

UNITED STATES PATENT AND TRADEMARK OFFICE
CERTIFICATE OF CORRECTION

PATENT NO. : 7,578,337 B2  Page 1 of 1
APPLICATION NO. : 11/262301
DATED : August 25, 2009
INVENTOR(S) : Spokoiny et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 210 days.

Signed and Sealed this

Seventh Day of September, 2010

David J. Kappos
*Director of the United States Patent and Trademark Office*